(12) United States Patent
Yuan et al.

(10) Patent No.: US 11,181,555 B2
(45) Date of Patent: Nov. 23, 2021

(54) CURRENT SENSING METHOD AND CURRENT SENSOR

(71) Applicants: Fu-Te Yuan, New Taipei (TW); Yen-Chi Lee, New Taipei (TW); Meng-Huang Lai, New Taipei (TW)

(72) Inventors: Fu-Te Yuan, New Taipei (TW); Yen-Chi Lee, New Taipei (TW); Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 26 days.

(21) Appl. No.: 16/391,339

(22) Filed: Apr. 23, 2019

(65) Prior Publication Data

US 2019/0331714 A1 Oct. 31, 2019

Related U.S. Application Data

(60) Provisional application No. 62/664,285, filed on Apr. 30, 2018.

(30) Foreign Application Priority Data

Mar. 15, 2019 (TW) .................. 108108764

(51) Int. Cl.
*G01R 15/18* (2006.01)
(52) U.S. Cl.
CPC .................. *G01R 15/185* (2013.01)
(58) Field of Classification Search
CPC .............. G01R 33/0011; G01R 33/093; G01R 33/098; G01R 15/185; G01R 15/205; G01R 17/10; G01R 17/105; G01R 33/0005; G01R 33/0023; G01R 33/0094; G01R 33/09; G01R 33/091
See application file for complete search history.

(56) References Cited

U.S. PATENT DOCUMENTS

| 5,554,932 A | 9/1996 | Jeffers |
| 9,423,469 B2 | 8/2016 | Gudel et al. |
| 2011/0006753 A1 | 1/2011 | Yu et al. |

(Continued)

FOREIGN PATENT DOCUMENTS

| CN | 1650608 | 8/2005 |
| CN | 102866276 | 1/2013 |

(Continued)

OTHER PUBLICATIONS

"Office Action of Taiwan Counterpart Application", dated Mar. 30, 2020, p. 1-p. 6.

(Continued)

*Primary Examiner* — Son T Le
*Assistant Examiner* — Adam S Clarke
(74) *Attorney, Agent, or Firm* — JCIPRNET

(57) ABSTRACT

A current sensing method and a current sensor are provided. The current sensing method includes the steps of: exciting a magnetic core to generate at least one pair of regions having opposite magnetization directions in the magnetic core; providing a current to pass through a sensing region of the magnetic core, so that the magnetic core correspondingly generates a magnetic field change; and sensing the magnetic field change of the magnetic core by a pickup coil wound around the magnetic core to output an output signal corresponding to the current.

14 Claims, 4 Drawing Sheets

(56) References Cited

U.S. PATENT DOCUMENTS

| | | | |
|---|---|---|---|
| 2011/0140688 A1* | 6/2011 | Yang | G01R 33/16 324/201 |
| 2011/0140694 A1* | 6/2011 | Cima | G01R 33/18 324/253 |
| 2014/0176132 A1 | 6/2014 | Chen et al. | |
| 2015/0108974 A1* | 4/2015 | Kennedy | G01R 33/098 324/252 |
| 2015/0160307 A1 | 6/2015 | Kim et al. | |
| 2016/0131687 A1 | 5/2016 | Higashi et al. | |
| 2016/0327618 A1* | 11/2016 | Yuan | G01C 17/28 |
| 2017/0074907 A1* | 3/2017 | Grno | H01F 38/40 |

FOREIGN PATENT DOCUMENTS

| | | |
|---|---|---|
| CN | 103123369 | 5/2013 |
| CN | 103137312 | 6/2013 |
| CN | 103959073 | 7/2014 |
| CN | 105738675 | 7/2016 |
| CN | 105981126 | 9/2016 |
| CN | 106093524 | 11/2016 |
| CN | 206832877 | 1/2018 |
| EP | 0658764 | 6/1995 |
| TW | 284849 | 9/1996 |
| WO | 2013154440 | 10/2013 |
| WO | 2014180703 | 11/2014 |

OTHER PUBLICATIONS

Xiaoying Hu, et al., "Adaptive AC current sensor using two opposite bias magnetic circuits with two tandem fiber Bragg gratings." 2017 Conference on Lasers and Electro-Optics Pacific Rim, Jul. 31-Aug. 4, 2017, pp. 1-3.

Yang Xiaoguang, et al., "A New Fluxgate Current Sensor with Cross Winding Structure." Chinese Journal of Sensors and Actuators, vol. 31, No. 1, Jan. 2018, pp. 1-5.

"Office Action of China Counterpart Application", dated Jan. 15, 2021, p. 1-p. 8.

* cited by examiner

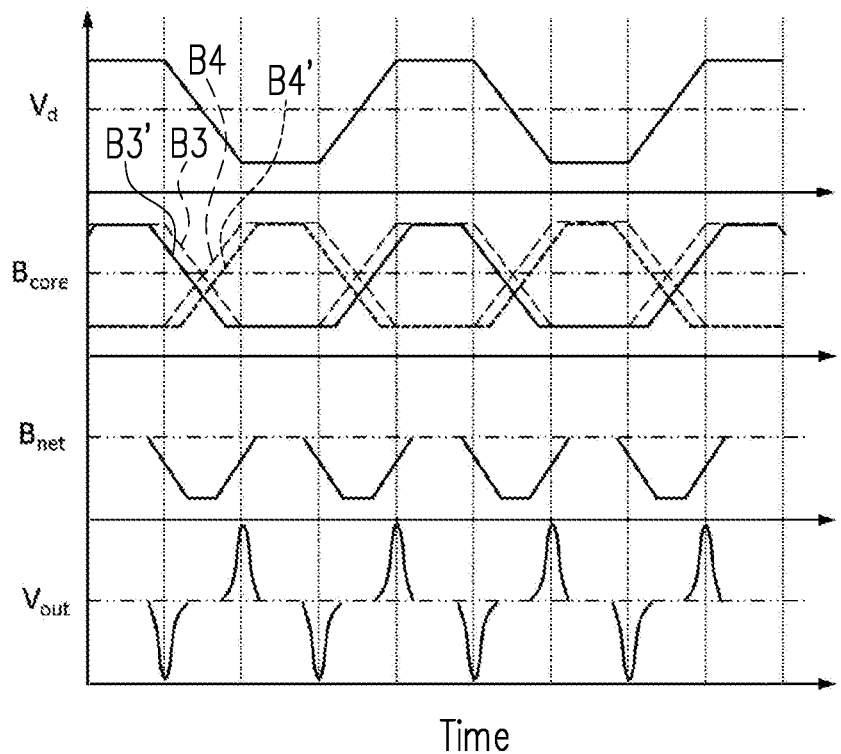

FIG. 7

```
┌─────────────────────────────────────────────┐
│ Exciting a magnetic core to generate at least one
│ pair of regions having opposite magnetization       │─ S810
│         directions in the magnetic core             │
└─────────────────────────────────────────────┘
                        │
                        ▼
┌─────────────────────────────────────────────┐
│ Providing a current to pass through a sensing region│
│  of the magnetic core, so that the magnetic core    │─ S820
│   correspondingly generates a magnetic field change │
└─────────────────────────────────────────────┘
                        │
                        ▼
┌─────────────────────────────────────────────┐
│ Sensing the magnetic field change of the magnetic core│
│   by a pickup coil wound around the magnetic core to │─ S830
│ output an output signal corresponding to the current │
└─────────────────────────────────────────────┘
```

FIG. 8

CURRENT SENSING METHOD AND CURRENT SENSOR

CROSS-REFERENCE TO RELATED APPLICATION

This application claims the priority benefits of U.S. provisional application Ser. No. 62/664,285, filed on Apr. 30, 2018, and Taiwan application serial no. 108108764, filed on Mar. 15, 2019. The entirety of each of the above-mentioned patent applications is hereby incorporated by reference herein and made a part of this specification.

BACKGROUND

1. Field of the Invention

The invention relates to a sensing technology, and more particularly, to a current sensing method and a current sensor.

2. Description of Related Art

At present, current controls like automatic control, power management, and leakage current sensing for related circuits applied in industrial and/or commercial electronic equipment have become very important. Current sensing technologies developed in recent years include, for example, a shunt resistor based on Ohm's law, a method for using transformer based on Faraday's law, a Rogowski coil, a fluxgate, a magnetic resistance (e.g., Anisotropic magnetoresistance (AMR), Giant Magnetoresistance (GMR) or Tunnel Magnetoresistance (TMR)), a Hall element and a current sensing means adopting Faraday effect (optical polarity). In particular, among the above technologies, the fluxgate plays an important rule in current industrial applications because the fluxgate has characteristics of a high precision over a wide current range, DC and AC measurement capabilities, a low thermal drift and a galvanic isolation.

SUMMARY OF THE INVENTION

In consideration of the above, the invention provides a current sensing method and a current sensor that can effectively sense current in a non-contact manner.

The current sensing method of the invention includes steps of: exciting a magnetic core to generate at least one pair of regions having opposite magnetization directions in the magnetic core; providing a current to pass through a sensing region of the magnetic core, so that the magnetic core correspondingly generates a magnetic field change; and sensing the magnetic field change of the magnetic core by a pickup coil wound around the magnetic core to output an output signal corresponding to the current.

The current sensor of the invention includes a magnetic core and a pickup coil. The magnetic core includes at least one pair of regions having opposite magnetization directions. When a current passes through a sensing region of the magnetic core, the magnetic core correspondingly generates a magnetic field change. The pickup coil is wound around the magnetic core. The pickup coil is configured to sense the magnetic field change of the magnetic core to output an output signal corresponding to the current.

Based on the above, the current sensing method and the current sensor can generate at least one pair of regions having opposite magnetization directions in the magnetic core by exciting the magnetic core and can provide a current to be sensed to pass through the sensing region the excited magnetic core. Then, the current sensing method and the current sensor can sense the magnetic change of the excited magnetic core by the pickup coil to output a sensing result corresponding to the current. Accordingly, the current sensing method and the current sensor can provide an accurate current sensing effect.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7 is a signal timing diagram of a sensing unit according to another embodiment of the invention.

FIG. 8 is a flowchart of a current sensing method according to an embodiment of the invention.

DESCRIPTION OF THE EMBODIMENTS

Figure 1:
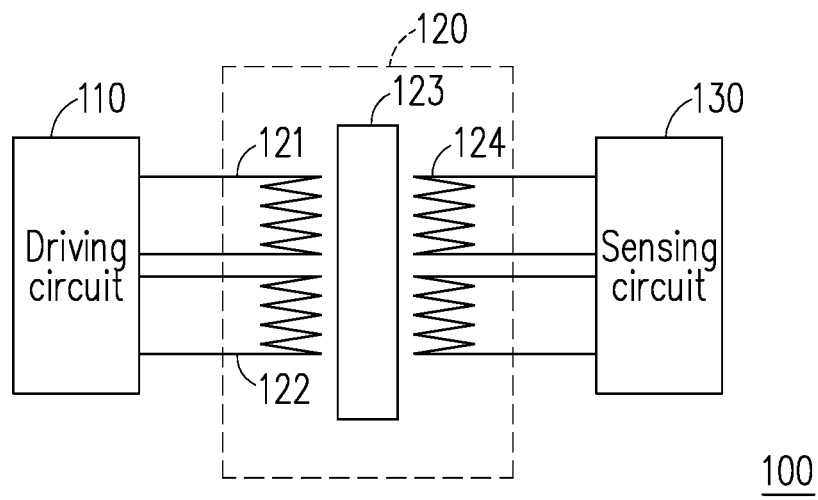
FIG. 1 is a block diagram illustrating a current sensor according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In order to make content of the present disclosure more comprehensible, embodiments are described below as the examples to prove that the present disclosure can actually be realized. Moreover, elements/components/steps with same reference numerals represent same or similar parts in the drawings and embodiments.

FIG. 1 is a block diagram illustrating a current sensor according to an embodiment of the invention. With reference to FIG. 1, a current sensor 100 includes a driving circuit 110, a sensing unit 120 and a sensing circuit 130. The sensing unit 120 includes one pair of excitation coils 121 and 122, a magnetic core 123 and a pickup coil 124. The magnetic core 123 may be, for example, a high permeability material such as a ferrite or a magnetic alloy, but not particularly limited by the invention. In this embodiment, each of the excitation coils 121 and 122 and the pickup coil 24 is wound around the magnetic core 123. In this embodiment, the driving circuit 110 is coupled to the excitation coils 121 and 122 to provide a driving signal to the excitation coils 121 and 122, so that one pair of regions having opposite magnetization directions is generated in the magnetic core 123. In this embodiment, the pickup coil 124 senses the magnetic core 123. Further, the sensing circuit 130 is coupled to the pickup coil 124 to receive a sensing result output by the pickup coil 124.

In this embodiment, the driving circuit 110 is configured to provide the driving signal with voltage polarity changed periodically to the excitation coils 121 and 122. Further, a periodically changed voltage waveform of the driving signal may be, for example, a sine wave, a triangular wave, a square wave, but not particularly limited by the invention. In this regard, magnetic fields generating by the excitation coils 121 and 122 driven by the driving circuit 110 can sense the magnetic core 123 so that the magnetic core 123 can generate one pair of regions having opposite magnetization directions and changed periodically. Further, each of said one pair of regions having the opposite magnetization directions in the magnetic core 123 can generate an identical magnetic flux on the sensing region. However, due to the opposite magnetization directions, a net magnetic flux on the sensing region is 0. Therefore, when the current flows through a wire to pass through the sensing region of the magnetic core 123, the sensing region the magnetic core 123 will correspondingly generate a magnetic field change so the pickup coil 124 can output an output signal corresponding to the sensing result according to the magnetic field change generated by the magnetic core 123.

Figure 2:
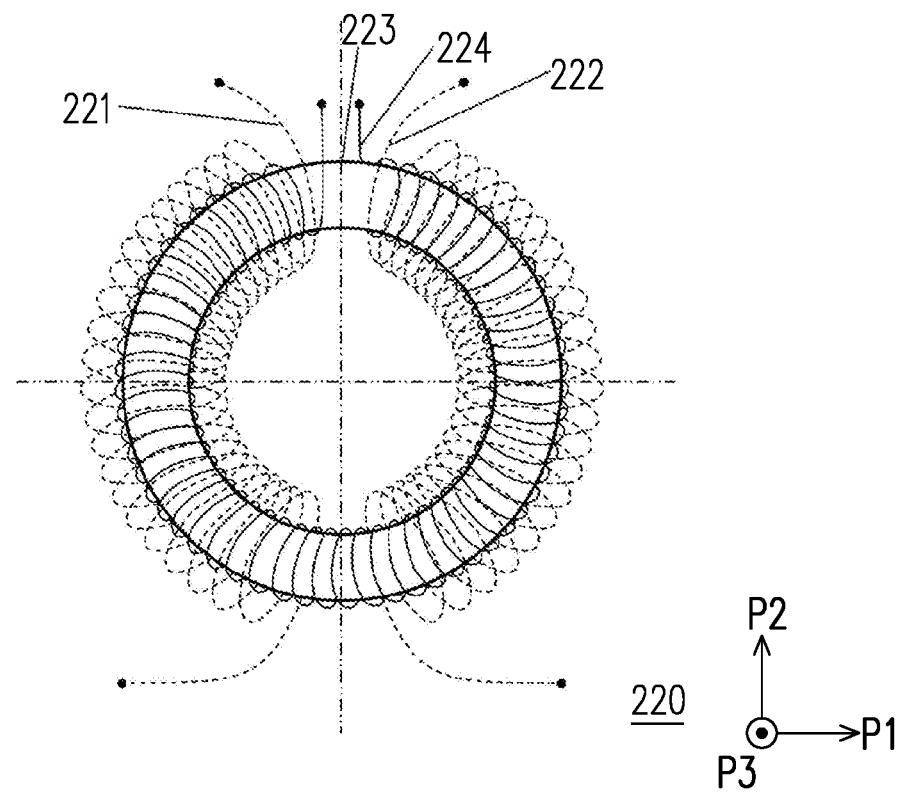
FIG. 2 is a schematic diagram of a sensing unit according to an embodiment of the invention.
Figure 3:
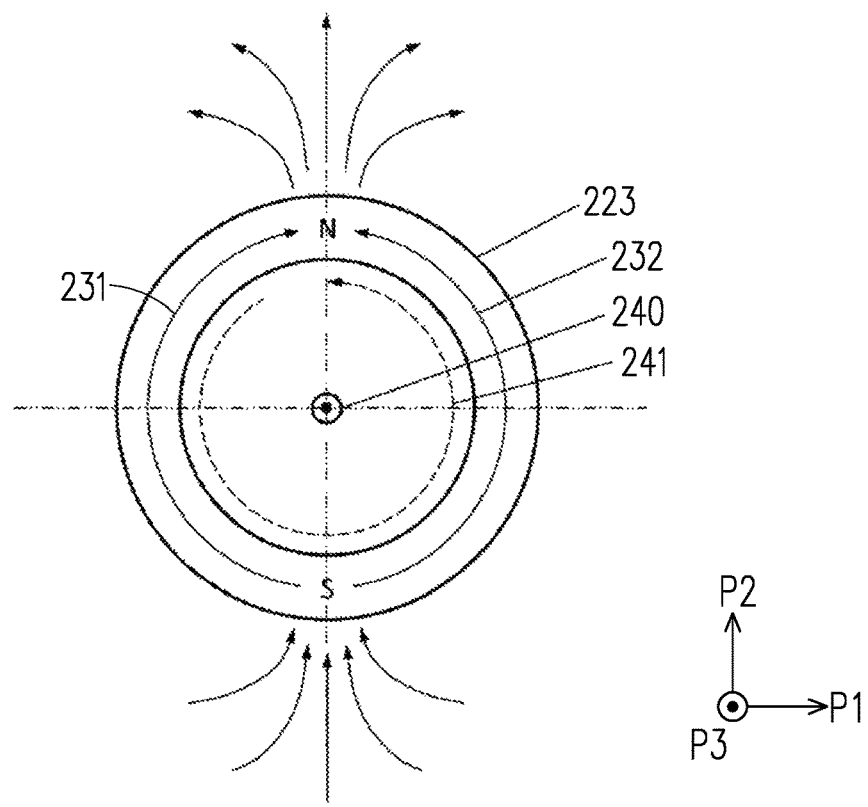
FIG. 3 is a schematic diagram of a magnetic field distribution of an excited magnetic core of FIG. 2 according to an embodiment of the invention.

FIG. 2 is a schematic diagram of a sensing unit according to an embodiment of the invention. FIG. 3 is a schematic diagram of a magnetic field distribution of an excited magnetic core of FIG. 2 according to an embodiment of the invention. With reference to FIG. 2 and FIG. 3, a sensing unit 220 includes one pair of excitation coils 221 and 222, a magnetic core 223 a pickup coil 224. In this embodiment, the magnetic core 223 is a closed magnetic core ring, but the invention is not limited thereto. In an embodiment, the magnetic core 223 may also be an open magnetic core ring, or a magnetic core structure of other shapes. In this embodiment, the excitation coil 211 is wound around one side of the magnetic core 223, and the excitation coil 222 is symmetrically wound around another side of the magnetic core 223. The excitation coils 221 and 222 are, for example, two wires wound around the magnetic core 223 in the same winding direction to symmetrically sense the magnetic core 223, but the invention is not limited thereto. In an embodiment, the excitation coils 221 and 222 may be the same wires wound around the magnetic core 223 in opposite directions to symmetrically sense the magnetic core 223.

As shown by FIG. 2, a winding region of the pickup coil 224 wound around the magnetic core 223 covers the excitation coils 221 and 222 wound around the magnetic core 223, but the invention is not limited thereto. The winding regions of the excitation coils 221 and 222 and the pickup coil 224 may be correspondingly designed according to different sensing requirements, and the invention is not limited by a winding result shown by FIG. 2. Specifically, two coil ends of the excitation coil 221 and two coil ends of the excitation coil 222 are respectively coupled to the driving circuit to synchronously receive the driving signal. In this way, the magnetic core 223 can generate one pair of opposite magnetic poles N and S as shown by FIG. 3, and form one pair of regions having opposite magnetization directions 231 and 232 between said one pair of opposite magnetic poles N and S. It should be noted that, when the excitation coils 221 and 222 receive the driving signal with voltage polarity changed periodically, the two magnetic poles N and S generated by exciting the magnetic core 223 will also be correspondingly and periodically exchanged.

As shown by FIG. 3, a closed region surrounded by the magnetic core 223 forms the sensing region, and a current 240 passes through the sensing region. In this embodiment, the sensing region is parallel to, for example, a plane formed by a first direction P1 and a second direction P2, and a current direction of the current 240 passing through the sensing region may be perpendicular to a plane of the sensing region. However, the invention is not limited in this regard. In this embodiment, the current direction of the current 240 is a third direction P3, and a magnetic field direction 241 of a magnetic field generated by the current 240 is counterclockwise. The first direction P1, the second direction P2 and the third direction P3 are perpendicular to one another. In this regard, the applied magnetic field of the current 240 affects the magnetic core 223 so that the magnetic field of the sensing region of the magnetic core 223 changes. Therefore, the pickup coil 224 can obtain a corresponding sensing signal based on the magnetic field change of the sensing region of the magnetic core 223, and two coil ends of the pickup coil 224 outputs an output signal corresponding to the current 240. In this embodiment, the output signal provided by the pickup coil 224 may be a voltage signal having one pair of positive and negative peak pulses being interleavedly output.

More specifically, the polar coordinate system ($\hat{r}$, $\hat{\theta}$, $\hat{z}$) is used to describe FIGS. 2 and 3. A center point of the sensing region of the magnetic core 223 is taken as the origin, and the current 240 is located at the center of the sensing region of the magnetic core 223. The excitation coils 221 and 222 will synchronously generate magnetic fields in the $+\hat{\theta}$ direction and in the $-\hat{\theta}$ direction to magnetize the magnetic core 223 so that the magnetic core 223 correspondingly generates one pair of regions having opposite magnetization directions ($+\hat{\theta}$, $-\hat{\theta}$) as shown by FIG. 3. Also, said one pair of regions having the opposite magnetization directions in the magnetic core 223 have magnetic fluxes with the same amplitude but opposite signs ($\omega_{CCW}$, $\omega_{CW}$). Further, since the magnetic core 223 is the closed magnetic core ring, a magnetic flux linkage $\psi$ in the magnetic core 223 can satisfy Equation (1) below.

$$\psi = n[\gamma \varphi_{CCW} + (1-\gamma)\varphi_{CW}] \tag{1}$$

In Equation (1) above, N is a turn number of the pickup coil 224. $\gamma$ is a proportion of the magnetic flux in the $+\hat{\theta}$ direction, and $(1-\gamma)$ is a proportion of the magnetic flux in the $-\hat{\theta}$ direction. Accordingly, based on Faraday's law, an output signal v provided by the pickup coil 224 can satisfy Equation (2) below. Also, in FIG. 3, $\gamma$ is 0.5. In other words, when there is no current flowing through the sensing region of the magnetic core 223, the magnetic flux linkage $\psi$ of the magnetic core 223 is 0 (the net magnetic flux is 0), and the output signal v is 0. However, when the current 240 flows through the sensing region of the magnetic core 223, the 2-pole excitation of the pickup coil 224 will be broken and the magnetic flux linkage $\psi$ of magnetic core 223 will change so that the output signal v becomes the voltage signal having one pair of positive and negative peak values being interleavedly output.

$$v = -\frac{d\psi}{dt} \tag{2}$$

Figure 4:
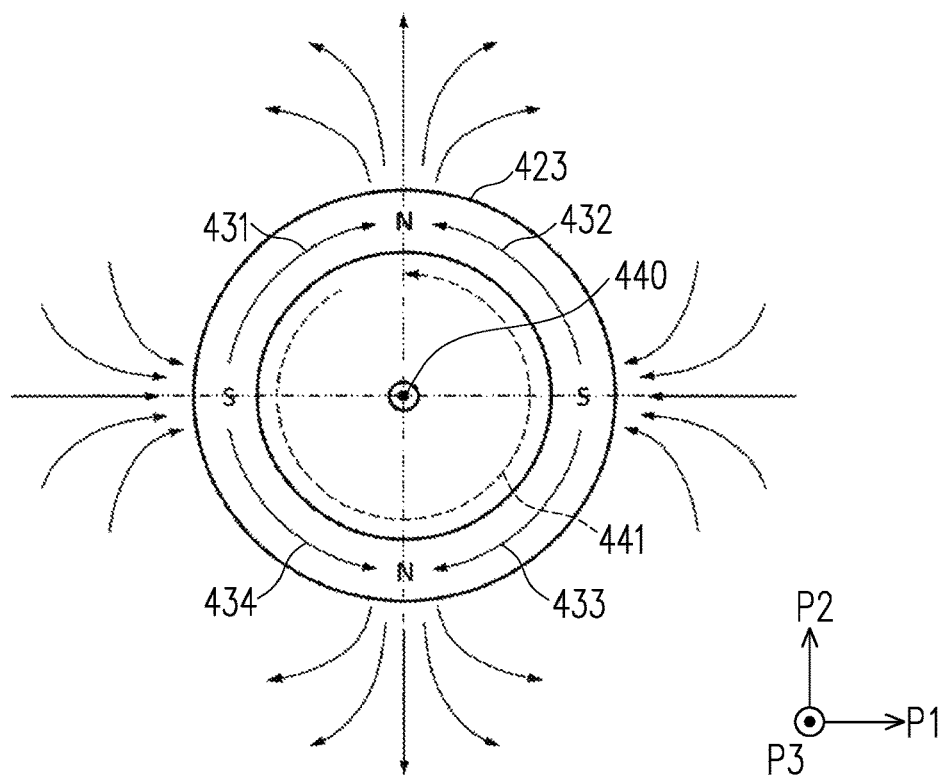
FIG. 4 is a schematic diagram of a magnetic field distribution of an excited magnetic core according to another embodiment of the invention.
Figure 5:
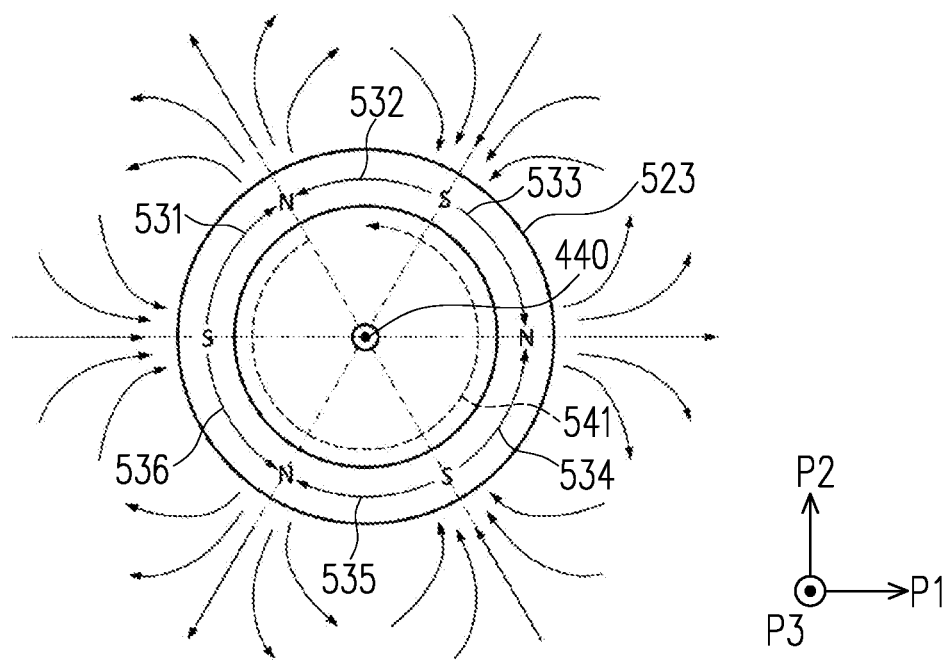
FIG. 5 is a schematic diagram of a magnetic field distribution of an excited magnetic core according to yet another embodiment of the invention.

It should be noted that, a magnetic field distribution result of the excited magnetic core in the invention is not limited to FIG. 3, and each of the following embodiments of FIG. 4 and FIG. 5 proposes a magnetic field distribution result of the magnetic core after the magnetic core is excited by multiple pairs of excitation coils.

FIG. 4 is a schematic diagram of a magnetic field distribution of an excited magnetic core according to another embodiment of the invention. With reference to FIG. 4, based on how the excitation coils 221 and 222 are wound around the magnetic core 223 in the embodiment of FIG. 2, two pairs of the excitation coils may be wound around on a magnetic core 423 in the same manner to excite the magnetic core 423, so as to generate two pairs of opposite magnetic poles N and S and form two pairs of regions having opposite magnetization directions 431 to 434 between the two pairs of opposite magnetic poles N and S. As shown by FIG. 4, a closed region surrounded by the magnetic core 423 forms the sensing region, and a current 440 passes through the sensing region. In this embodiment, the sensing region is parallel to, for example, a plane formed by the first direction P1 and the second direction P2, and a current direction of the current 440 passing through the sensing region may be perpendicular to a plane of the sensing region. However, the invention is not limited in this regard. In this embodiment, the current direction of the current 440 is the third direction P3, and a magnetic field direction 441 of a magnetic field generated by the current 440 is counterclockwise. In this regard, the magnetic field of the current 440 affects the magnetic core 423 so that the magnetic field of the sensing region of the magnetic core 423 changes. Accordingly, the excited magnetic core 423 of this embodiment can also sense the magnetic field change of the sensing region of the magnetic core 423 to effectively obtain a current sensing result of the current 440.

FIG. 5 is a schematic diagram of a magnetic field distribution of an excited magnetic core according to yet another embodiment of the invention. With reference to FIG. 5, based on how the excitation coils 221 and 222 are wound around the magnetic core 223 in the embodiment of FIG. 2, three pairs of the excitation coils may be wound around on a magnetic core 523 in the same manner to excite the magnetic core 523, so as to generate three pairs of opposite magnetic poles N and S and form three pairs of regions having opposite magnetization directions 531 to 536 between the three pairs of opposite magnetic poles N and S. As shown by FIG. 5, a closed region surrounded by the magnetic core 523 forms the sensing region, and a current 540 passes through the sensing region. In this embodiment, the sensing region is parallel to, for example, a plane formed by the first direction P1 and the second direction P2, and a current direction of the current 540 passing through the sensing region may be perpendicular to a plane of the sensing region. However, the invention is not limited in this regard. In this embodiment, the current direction of the current 540 is the third direction P3, and a magnetic field direction 541 of a magnetic field generated by the current 540 is counterclockwise. In this regard, the magnetic field of the current 540 affects the magnetic core 523 so that the magnetic field of the sensing region of the magnetic core 523 changes. Accordingly, the excited magnetic core 523 of this embodiment can also sense the magnetic field change of the sensing region of the magnetic core 523 to effectively obtain a current sensing result of the current 540.

Figure 6:
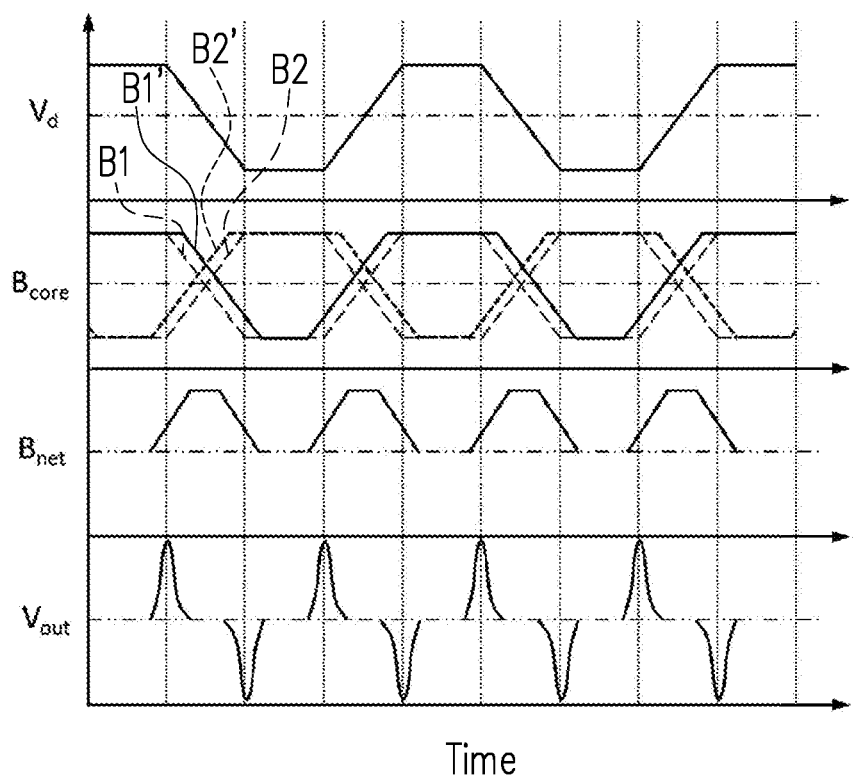
FIG. 6 is a signal timing diagram of a sensing unit according to an embodiment of the invention.

FIG. 6 is a signal timing diagram of a sensing unit according to an embodiment of the invention. With reference to FIG. 2 and FIG. 6, the signal timing diagram of this embodiment is adapted to the sensing unit 220 of FIG. 2. In this embodiment, the two coil ends of the excitation coil 221 and the two coil ends of the excitation coil 222 can simultaneously receive a driving signal $V_d$ provided by the driving circuit. As shown by FIG. 6, the driving signal $V_d$ has a change curve with voltage polarity changed periodically. In this embodiment, when there is no current flowing through the sensing region of the magnetic core 223, a magnetic field $B_{core}$ generated by said one pair of regions having the opposite magnetization directions 231 and 232 of the magnetic core 223 have magnetic field change results shown by change curves B1 and B2 in FIG. 6.

However, when a current passes through the center of the sensing region of the magnetic core 223 in the third direction P3, because a magnetic flux balance (a.k.a. a magnetic field balance) of the sensing region of the magnetic core 223 is broken, the magnetic field $B_{core}$ generated by said one pair of regions having the changed periodically opposite magnetization directions 231 and 232 of the magnetic core 223 will be changed into magnetic field change results shown by change curves B1' and B2' in FIG. 6 in correspondence to the applied magnetic field provided by the current. For instance, the magnetic field change of the region of the magnetic core 223 with the magnetization direction being clockwise will be advanced (the change curve is shifted to the left), and the magnetic field change of the region of the magnetic core 223 with the magnetization direction being counterclockwise will be delayed (the change curve is shifted to the right).

In this regard, because the magnetic flux balance of the sensing region of the magnetic core 223 is broken, a change of a net magnetic field $B_{net}$ of the magnetic core 223 (a sum of the magnetic fields of the two regions) is as shown by FIG. 6. Also, the pickup coil 224 can obtain an output signal $V_{out}$ shown by FIG. 6 based on Equation (2) above. The output signal $V_{out}$ is a voltage signal having one pair of positive and negative peak values being interleavedly output, where the positive peak pulse follows the negative peak pulse. In this way, when the current passing through the sensing region of the magnetic core 223 changes, since the output signal $V_{out}$ will change correspondingly, related back-end signal processing circuits for receiving the output signal $V_{out}$ can accurately predict a change result of the current by analyzing a change result corresponding to the output signal V out.

FIG. 7 is a signal timing diagram of a sensing unit according to another embodiment of the invention. With reference to FIG. 2 and FIG. 7, the signal timing diagram of this embodiment is adapted to the sensing unit 220 of FIG. 2. In this embodiment, the two coil ends of the excitation coil 221 and the two coil ends of the excitation coil 222 can simultaneously receive a driving signal $V_d$ provided by the driving circuit. As shown by FIG. 7, the driving signal $V_d$ has a change curve with voltage polarity changed periodically. In this embodiment, when there is no current flowing through the sensing region of the magnetic core 223, a magnetic field $B_{core}$ generated by said one pair of regions having the opposite magnetization directions 231 and 232 of the magnetic core 223 have magnetic field change results shown by change curves B3 and B4 in FIG. 7.

However, when a current passes through the center of the sensing the magnetic core 223 in a direction opposite to the third direction P3, because the magnetic flux balance of the sensing region of the magnetic core 223 is broken, the magnetic field $B_{core}$ generated by said one pair of regions having the changed periodically opposite magnetization directions 231 and 232 of the magnetic core 223 will be changed into magnetic field change results shown by change curves B3' and B4' in FIG. 7 in correspondence to the applied magnetic field provided by the current. For instance, the magnetic field change of the region of the magnetic core 223 with the magnetization direction being clockwise will be delayed (the change curve is shifted to the right), and the magnetic field change of the region of the magnetic core 223 with the magnetization direction being counterclockwise will be advanced (the change curve is shifted to the left).

In this regard, because the magnetic flux balance of the sensing region of the magnetic core 223 is broken, a change of a net magnetic field $B_{net}$ of the magnetic core 223 (a sum of the magnetic fields of the two regions) is as shown by FIG. 7. Also, the pickup coil 224 can obtain an output signal $V_{out}$ shown by FIG. 7 based on Equation (2) above. The output signal $V_{out}$ is a voltage signal having one pair of positive and negative peak values being interleavedly output, where the negative peak pulse follows the positive peak pulse. In this way, when the current passing through the sensing region of the magnetic core 223 changes, since the output signal $V_{out}$ will change correspondingly, related back-end signal processing circuits for receiving the output signal $V_{out}$ can accurately predict a change result of the current by analyzing a change result corresponding to the output signal $V_{out}$.

FIG. 8 is a flowchart of a current sensing method according to an embodiment of the invention. With reference to FIG. 1 and FIG. 8, the current sensing method of this embodiment may be adapted to at least the current sensor 100 in the embodiment of FIG. 1. The current sensor 100 can execute steps S810 to S830. In step S810, the driving circuit 110 excites the magnetic core 123 by the excitation coils 121 and 122, so that one pair of regions having opposite magnetization directions is generated in the magnetic core 123. In step S820, a current is provided via a wire to pass through a sensing region of the magnetic core 123, so that the magnetic core 123 correspondingly generates a magnetic field change. In step S830, the pickup coil 124 wound around the magnetic core senses the magnetic field change of the magnetic core 123 to output an output signal corresponding to the current to the sensing circuit 130. Accordingly, the current sensing method of this embodiment can allow the current sensor 100 to provide the accurate current sensing effect.

In addition, enough teaching, suggestion, and implementation regarding related device features, implementation methods and technical details of the current sensor 100 of this embodiment may be obtained with reference to the foregoing embodiments of FIG. 1 to FIG. 7, which are not repeated hereinafter.

In summary, according to the current sensing method and the current sensor of the invention, by exciting the magnetic core to generate at least one opposite magnetic poles, at least one pair of regions having opposite magnetization directions can be generated in the magnetic core, and after providing the current to the sensing region of the excited magnetic core, the magnetic field change of the magnetic core can be sensed by the pickup coil wound around the magnetic core so as to output the output signal corresponding to the current. As a result, the current sensing method and the current sensor of the invention can effectively sense the current flowing through the sensing region of the magnetic core so that the back-end signal processing circuits can accurate determine the change result of the current by analyzing the output signal provided by the current sensor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A current sensing method, comprising:
exciting a magnetic core to generate at least one pair of regions having opposite magnetization directions in the magnetic core;
providing a current to pass through a sensing region of the magnetic core, so that the magnetic core correspondingly generates a magnetic field change;
sensing the magnetic field change of the magnetic core by a pickup coil wound around the magnetic core to output an output signal corresponding to the current; and
providing a driving signal by a driving circuit to at least one pair of excitation coils wound around the magnetic core so that the at least one pair of excitation coils excite the magnetic core to generate at least one pair of opposite magnetic poles in the magnetic core, wherein the pickup coil is disposed between the magnetic core and the at least one pair of excitation coils from a cross-sectional view of the pickup coil, the magnetic core, and the excitation coils.

2. The current sensing method according to claim 1, wherein a winding region of the pickup coil wound on the magnetic core along a surface of the magnetic core is wrapping around the at least one pair of excitation coils wound on the magnetic core along the surface of the magnetic core.

3. The current sensing method according to claim 1, wherein the driving signal is a voltage signal having a periodically changed waveform, and two magnetic poles generated by exciting the magnetic core located in two opposite positions of the magnetic core periodically exchange positions.

4. The current sensing method according to claim 3, wherein a magnetic flux generated on the sensing region by each of the at least one pair of regions having the opposite magnetization directions in the magnetic core is changed according to the driving signal, and a magnetic field change generated on the sensing region by each of the at least one pair of regions having the opposite magnetization directions in the magnetic core is advanced or delayed corresponding to a current direction of the current.

5. The current sensing method according to claim 1, wherein the magnetic core is a closed magnetic core ring, and a closed region surrounded by the closed magnetic core ring forms the sensing region.

6. The current sensing method according to claim 1, wherein a current direction of the current passing through the sensing region is perpendicular to a plane of the sensing region.

7. The current sensing method according to claim 1, wherein when a wire passing through the sensing region of the magnetic core does not provide the current, each of the at least one pair of regions having the opposite magnetization directions in the magnetic core provide an identical magnetic flux on the sensing region.

8. A current sensing method, comprising:
a magnetic core, comprising at least one pair of regions having opposite magnetization directions, wherein when a current passes through a sensing region of the magnetic core, the magnetic core correspondingly generates a magnetic field change;
a pickup coil, wound around the magnetic core, and configured to sense the magnetic field change of the magnetic core to output an output signal corresponding to the current;
at least one pair of excitation coils, wound around the magnetic core, wherein the pickup coil is disposed between the magnetic core and the at least one pair of excitation coils from a cross-sectional view of the pickup coil, the magnetic core, and the excitation coils; and a driving circuit, coupled to the at least one pair of excitation coils, and configured to provide a driving signal to the at least one pair of excitation coils so that the at least one pair of excitation coils excite the magnetic core to generate at least one pair of opposite magnetic poles in the magnetic core.

9. The current sensor according to claim 8, wherein a winding region of the pickup coil wound on the magnetic core along a surface of the magnetic core is wrapping around the at least one pair of excitation coils wound on the magnetic core along the surface of the magnetic core.

10. The current sensor according to claim 8, wherein the driving signal is a voltage signal having a periodically changed waveform, and two magnetic poles generated by exciting the magnetic core located in two opposite positions of the magnetic core periodically exchange positions.

11. The current sensor according to claim 10, wherein a magnetic flux generated on the sensing region by each of the at least one pair of regions having the opposite magnetization directions in the magnetic core is changed according to the driving signal, and a magnetic field change generated on the sensing region by each of the at least one pair of regions having the opposite magnetization directions in the magnetic core is advanced or delayed corresponding to a current direction of the current.

12. The current sensor according to claim 8, wherein the magnetic core is a closed magnetic core ring, and a closed region surrounded by the closed magnetic core ring forms the sensing region.

13. The current sensor according to claim 8, wherein a current direction of the current passing through the sensing region is perpendicular to a plane of the sensing region.

14. The current sensor according to claim 8, wherein when a wire passing through the sensing region of the magnetic core does not provide the current, each of the at least one pair of regions having the opposite magnetization directions in the magnetic core provide an identical magnetic flux on the sensing region.

* * * * *